(12) United States Patent
Ishizawa et al.

(10) Patent No.: US 7,744,798 B2
(45) Date of Patent: *Jun. 29, 2010

(54) METHOD OF FORMING FILM ON MOLDED BODY, METHOD OF PRODUCING MOLDED BODY WITH FILM FORMED THEREON, MOLD FOR PRODUCING MOLDED BODY WITH FILM FORMED THEREON

(75) Inventors: Motosuke Ishizawa, Kiryu (JP); Takao Umezawa, Ota (JP)

(73) Assignee: Mitsuba Corporation, Kiryu-shi (JP)

( * ) Notice: Subject to any disclaimer, the term of this patent is extended or adjusted under 35 U.S.C. 154(b) by 1221 days.

This patent is subject to a terminal disclaimer.

(21) Appl. No.: 10/557,475

(22) PCT Filed: May 17, 2004

(86) PCT No.: PCT/JP2004/006979
§ 371 (c)(1), (2), (4) Date: Nov. 18, 2005

(87) PCT Pub. No.: WO2004/101253
PCT Pub. Date: Nov. 25, 2004

(65) Prior Publication Data
US 2007/0018351 A1 Jan. 25, 2007

(30) Foreign Application Priority Data
May 19, 2003 (JP) .............................. 2003-140060

(51) Int. Cl.
*B29C 65/02* (2006.01)
*B29C 33/34* (2006.01)
(52) U.S. Cl. ........................... 264/255; 425/95; 425/91; 425/518; 425/134; 425/347; 427/591
(58) Field of Classification Search ................ 425/134, 425/518, 95, 347, 91; 427/591
See application file for complete search history.

(56) References Cited
U.S. PATENT DOCUMENTS
3,462,524 A * 8/1969 Lemelson .................. 264/255

(Continued)

FOREIGN PATENT DOCUMENTS
JP A 61-215020 9/1986

(Continued)

OTHER PUBLICATIONS
Notice of Allowance mailed Mar. 9, 2010 for U.S. Appl. No. 10/557,784.

*Primary Examiner*—Philip C Tucker
*Assistant Examiner*—Alison Hindenlang
(74) *Attorney, Agent, or Firm*—Oliff & Berridge, PLC

(57) ABSTRACT

When integrally producing a lamp holder, which is provided with a lamp body and a lens portion, by using a mold-sliding injection system, a lamp holder having a reflection surface formed on the interior surface thereof is produced. A fixed mold is provided with a vacuum deposition apparatus, wherein a lamp holder having a reflection surface is produced by a reflection surface forming process, which is provided between a primary injection process for molding a lamp holder and a lens portion and a secondary injection process for integrating the lamp holder and the lens portion by matching the same together, for vacuum-depositing the reflection surface on the interior surface of the lamp holder.

35 Claims, 13 Drawing Sheets

U.S. PATENT DOCUMENTS

| | | | | |
|---|---|---|---|---|
| 3,861,955 | A * | 1/1975 | Lemelson | 427/131 |
| 6,468,458 | B1 * | 10/2002 | Anderson et al. | 264/246 |
| 6,506,326 | B1 * | 1/2003 | Abbott et al. | 264/104 |
| 6,746,634 | B2 * | 6/2004 | Shimakura | 264/1.9 |
| 2002/0057578 | A1 * | 5/2002 | Kageyama et al. | 362/544 |

FOREIGN PATENT DOCUMENTS

| | | |
|---|---|---|
| JP | B2 63-36627 | 7/1988 |
| JP | B2 2-38377 | 8/1990 |
| JP | A 11-162210 | 6/1999 |
| JP | A 11-250702 | 9/1999 |
| JP | A 2002-144370 | 5/2002 |

\* cited by examiner

Movement of masking member → Taking away of molding

Taking away of molding

METHOD OF FORMING FILM ON MOLDED BODY, METHOD OF PRODUCING MOLDED BODY WITH FILM FORMED THEREON, MOLD FOR PRODUCING MOLDED BODY WITH FILM FORMED THEREON

This application is the U.S. National Stage of PCT/JP2004-006979, filed May 17, 2004, which claims priority from JP2003-140060, filed May 19, 2003, the entire disclosures of which are incorporated herein by reference thereto.

Further, this application is related to the U.S. National Stage of PCT/JP2004/006981, filed May 17, 2004, U.S. patent application Ser. No. 10/557,784, filed Nov. 18, 2005, the entire disclosure of which is incorporated herein by reference thereto.

BACKGROUND

The disclosure relates to a film forming method for various types of moldings including headlamps, blinkers (including side blinkers), and tail lamps, etc., a method for producing film-formed moldings and a mold for producing the film-formed moldings.

Generally, as such a type of molding, there is a molding, such as a lamp body of a headlamp for a vehicle, having a mirror-finished surface being a reflection surface film-formed on the injection-molded molding to increase the light amount and to secure a wider range of irradiation. However, conventionally, a lamp body is produced so that a lamp holder in which a bulb is incorporated and a lens portion formed of resin having transmittance are mold-matched, and the surfaces of the mold-matched portions are adhered together. As such a production method, a mold-slide injection system has been known, for example, refer to Japanese Patent Application No. 62-087315, now Patent Publication No. Hei-2-38377. According thereto, after a lamp holder and a lens portion, which are primary products, are respectively injection-molded in a state where a movable mold and a fixed mold are disposed so as to be opposed to each other, the movable mold is caused to slide, and the respective primary products are mold-matched to be matched to each other. Then, a resin material is secondarily injected to the mold-matched portions of the primary products, thereby integrally molding the lamp body.

SUMMARY

However, such a type of molding cannot cope with a case where a reflection surface is formed on a lamp holder as described above. Therefore, in a case of forming the reflection surface, after a primary injection-molded lamp holder is once removed from a mold, and a reflection surface is formed on the inner surface of the lamp holder by using film-forming means, such as vacuum deposition or sputtering, etc., the lamp holder is set in the mold again, and the matching portions of the primary injection-molded products are subjected to secondary injection molding to integrate the lamp holder and the lens portion.

However, if a hand is brought into contact with the film-formed reflection surface or an oily substance is adhered thereto, when setting the molded lamp holder in the forming container, and then a film-forming operation such as vacuum deposition is carried out, satisfactory reflection surface formation of the portion to which the oil substance is adhered may be spoiled, resulting in a defective product. Therefore, it is necessary to carefully handle the lamp holder. At the same time, it is also noted, that when setting the lamp holder again, the lamp holder must be quickly and accurately set in the mold because the lamp holder contracts due to cooling. As a result there is a problem in that the work efficiency is worsened, and the product yield is low. This point is an object to be solved by the invention.

The following was developed with an object to solve the above-described problems in view of the above-described situations.

A first aspect of the disclosure is a method for forming a film on a molding, in which, when forming a film with masking on a molding molded by a plurality of molds, a masking means is at least one of the plurality of molds.

A second aspect of the disclosure is the method for forming a film on a molding according to the first aspect, wherein the mold for masking is at least one of a plurality of molds provided for molding a molding, and the molding is not removed from the mold for masking in a film-forming step.

A third aspect of the disclosure is a method for forming a film on a molding according to the first aspect or the second aspect, wherein molds for forming a molding are composed of at least two molds structured so as to be matched to each other, the method comprising the steps of removing a molding molded in a mold-matched state, where the two molds are combined, in a state where the molding is not removed from at least one of the molds; mold-matching a film-forming means to the mold from which the molding is not removed; and forming a film by the film-forming means so that at least portions of the molding, which are not removed from the mold, are masked.

A fourth aspect of the disclosure is a method for forming a film on a molding according to the third aspect, wherein the film-forming means is provided in a mold from which a molding is removed.

A fifth aspect of the disclosure is a method for forming a film on a molding according to the third aspect or the fourth aspect, wherein parts of the surface of the molding, which are exposed by removal of a mold, are further masked by a masking member.

A sixth aspect of the disclosure is a method for forming a film on a molding according to the fifth aspect, wherein the masking member is incorporated in a step between the mold-removing step and the mold-matching step.

A seventh aspect of the disclosure is a method for forming a film on a molding according to the fifth aspect or the sixth aspect, wherein the masking member is provided in the film-forming means, and masking is carried out in the mold-matching step of the corresponding film-forming means.

An eighth aspect of the disclosure is a method for forming a film on a molding according to the seventh aspect, wherein the masking member is a peripheral edge portion at the opening side of a recessed accommodation portion for accommodating the body of the film-forming means.

A ninth aspect of the disclosure is a method for producing a film-formed molding, which is featured in comprising a first mold-matching step for matching at least a first mold and a second mold together, which are provided to form moldings; a step of molding moldings; a mold-removing step of removing the second mold from the formed molding in a state where the molding is not removed from the first mold; a second mold-matching step for matching a film-forming means to a molding supported in the first mold; and a film-forming step for forming a film on the molding so that at least portions not removed from the first mold are masked by the film-forming means.

A tenth aspect of the disclosure is a method for producing a film-formed molding according to the ninth aspect, wherein the first mold-matching step and the second mold-matching step are simultaneously carried out, and the molding step and the film-forming step are simultaneously carried out.

An eleventh aspect of the disclosure is a method for producing a film-formed molding according to the ninth aspect or the tenth aspect, wherein the film-forming means is provided in the second mold.

A twelfth aspect of the disclosure is a method for producing a film-formed molding according to the ninth aspect, the tenth aspect or the eleventh aspect, wherein the first mold is a movable mold, and the second mold is a fixed mold.

A thirteenth aspect of the disclosure is a method for producing a film-formed molding according to any one of the ninth aspect to the twelfth aspect, wherein a formed film is a reflection surface.

A fourteenth aspect of the disclosure is a method for producing a film-formed molding according to any one of the ninth aspect to the thirteenth aspect, further comprising a step of masking a part of the surface exposed by mold removal of the second mold by a masking member prior to the film-forming step.

A fifteenth aspect of the disclosure is a method for producing a film-formed molding according to the fourteenth aspect, wherein the masking member is incorporated in a step between the mold-removing step and the second mold-matching step.

A sixteenth aspect of the disclosure is a method for producing a film-formed molding according to any one of the thirteenth aspect to the fifteenth aspect, wherein the masking member is a peripheral edge portion at the opening side of a recessed portion provided so as to accommodate a film-forming means body in the second mold.

A seventeenth aspect of the disclosure is a method for producing a film-formed molding according to any one of the fourteenth aspect to the sixteenth aspect, wherein the masking member is a mold surface for masking, which is movably formed in the second mold, and a masking portion of the molding is masked by the mold surface for masking being moved simultaneously with, before, or after the secondary mold-matching step.

An eighteenth aspect of the disclosure is a method for producing a film-formed molding according to any one of the thirteenth aspect to the seventeenth aspect, wherein a portion masked by the masking member is a portion which is electrically insulated.

A nineteenth aspect of the disclosure is a method for producing a film-formed molding according to any one of the thirteenth aspect to the eighteenth aspect, wherein a portion masked by the masking member is an adhesion surface portion where a third molding is adhered to the molding.

A twentieth aspect of the disclosure is a method for producing a film-formed molding, comprising a first mold-matching step for matching at least the first mold and the second mold, which are provided to mold a first molding and a second molding, to each other; a step of simultaneously molding the first molding and the second molding; a step of removing the formed first molding from the second mold in a state where the molding is not removed from the first mold, and of removing the second molding from the first mold in a state where the second molding is not removed from the second mold; a second mold-matching step by which a film-forming means is matched to the first molding; a step of forming a film on the first molding by the film-forming means so that the portion not removed from the first mold is masked; a step of separating the film-forming means from the first molding; a third mold-matching step for matching the first mold and the second mold so that the first molding and the second molding are matched to each other; and a step of adhering the first molding to the second molding.

A twenty-first aspect of the disclosure is a method for producing a film-formed molding according to the twentieth aspect, wherein the film-forming means is provided in the second mold.

A twenty-second aspect of the disclosure is a method for producing a film-formed molding according to the twenty-first aspect, wherein the first mold is a movable mold and the second mold is a fixed mold.

A twenty-third aspect of the disclosure is a method for producing a film-formed molding according to any one of the nineteenth aspect to the twenty-second aspect, wherein a formed film is a reflection surface.

A twenty-fourth aspect of the disclosure is a method for producing a film-formed molding according to any one of the nineteenth aspect to the twenty-third aspect, further comprising a step of masking a part of the surface exposed by removal of the second mold by means of a masking member prior to a film-forming step.

A twenty-fifth aspect of the disclosure is a method for producing a film-formed molding according to the twenty-fourth aspect, wherein the masking member is incorporated in a step between the mold-removing step and the second mold-matching step.

A twenty-sixth aspect of the disclosure is a method for producing a film-formed molding according to the twenty-fourth aspect or the twenty-fifth aspect, wherein the masking member is a peripheral edge portion at the opening side of a recessed portion provided so as to accommodate the film-forming means body in the second mold.

A twenty-seventh aspect of the disclosure is a method for producing a film-formed molding according to any one of the twenty-fourth aspect to the twenty-sixth aspect, wherein the masking member is a mold surface for masking, which is movably formed in the second mold, and a masking portion of the molding is masked by the mold surface for masking being moved simultaneously with, before, or after the second mold-matching step.

A twenty-eighth aspect of the disclosure is a method for producing a film-formed molding according to any one of the twenty-fourth aspect to the twenty-seventh aspect, wherein a portion masked by the masking member is a portion which is electrically insulated.

A twenty-ninth aspect of the disclosure is a method for producing a film-formed molding according to any one of the twenty-fourth aspect to the twenty-eighth aspect, wherein a portion masked by the masking member is an adhesion surface portion between the first molding and the second molding.

A thirtieth aspect of the disclosure is a mold for producing a film-formed molding, the mold comprises at least a first mold having a mold face for forming one face portion of a molding, and a second mold having a mold face for forming the other face portion of the molding, the second mold provided with a film-forming means for forming a film on a molding supported by the first mold.

A thirty-first aspect of the disclosure is a mold for producing a film-formed molding according to the thirtieth aspect, wherein the first mold is a movable mold and the second mold is a fixed mold.

A thirty-second aspect of the disclosure is a mold for producing a film-formed molding according to the thirtieth aspect or the thirty-first aspect, wherein the film-forming means is provided and accommodated in an accommodation portion secured in the second mold.

A thirty-third aspect of the disclosure is a mold for producing a film-formed molding according to any one of the thirtieth aspect to the thirty-second aspect, wherein the film-forming means forms a film so that a portion supported and hidden by the first mold is masked.

A thirty-fourth aspect of the disclosure is a mold for producing a film-formed molding according to any one of the thirtieth aspect to the thirty-third aspect, wherein a masking portion for masking a portion, on which film is not formed, of the surface of the molding exposed by removal from the first mold is formed in the second mold.

A thirty-fifth aspect of the disclosure is a mold for producing a film-formed molding according to the thirty-fourth aspect, wherein the masking portion is a peripheral edge portion at the opening side of a recessed portion formed in the second mold so as to accommodate the film-forming means body.

A thirty-sixth aspect of the disclosure is a mold for producing a film-formed molding according to the thirty-fourth aspect, wherein the masking portion is a mold surface for masking, which is movably provided in the second mold.

A thirty-seventh aspect of the disclosure is a mold for producing a film-formed molding according to the thirtieth aspect, wherein a mold surface is formed in the second mold, which is matched to the molding supported in the first mold, the mold surface serving for a covering portion for which materials removable from the molding are injected to a portion, on which film is not formed, of the molding.

A thirty-eighth aspect of the disclosure is a mold for producing a film-formed molding according to any one of the thirtieth aspect to the thirty-seventh aspect, wherein a pair of mold surfaces for producing a molding are provided in the first mold with a predetermined space therebetween, and in the second mold are provided a film-forming means and a pair of mold surfaces for producing a film-formed molding, between which the film-forming means is placed with the predetermined space therebetween.

A thirty-ninth aspect of the disclosure is a mold for producing a film-formed molding according to any one of the thirtieth aspect to the thirty-seventh aspect, wherein a pair of mold surfaces for producing a molding are provided in the first mold with a predetermined space therebetween, and in the second mold are a mold surface for producing a molding, and a pair of film-forming means, between which are disposed so that the mold surface for producing the molding is placed with the predetermined space therebetween.

A fortieth aspect of the disclosure is a mold surface for producing a film-formed molding according to the thirty-eighth aspect or the thirty-ninth aspect, wherein a pair of mold surfaces formed in the mold are devised so that the same moldings are mold-formed.

A forty-first aspect of the disclosure is a mold surface for producing a film-formed molding according to the thirty-eighth aspect or the thirty-ninth aspect, wherein a pair of mold surfaces formed in the mold are devised so that the same moldings are mold-formed.

According to the first aspect, when forming a film on a molding, it is possible to carry out masking by effectively using at least one mold to form the molding.

According to the second aspect, it becomes possible to form a film onto a molding, immediately after being molded, which is not removed from at least one mold, with masking provided.

According to the third aspect, because forming and film formation of a molding can be carried out by a series of mold-molding steps, work efficiency can be improved.

According to the fourth aspect, because a film-forming means is provided in a mold from which a molding is removed, molding and film-formation can be carried out by a series of mold moldings.

According to the fifth aspect, masking can be concurrently carried out at a portion exposed by mold removal.

According to the sixth aspect, when masking is carried out using a masking member, it becomes possible to carry out incorporation of the masking member in a series of processes.

According to the seventh aspect, it is possible to carry out masking by effectively using the film-forming means.

According to the eighth aspect, the peripheral edge of the accommodation portion in which the film-forming means is accommodated can be used as the masking member.

According to the ninth aspect, it becomes possible to produce a film-formed molding by a series of mold-moldings.

According to the tenth aspect, because a film-formed molding can be produced by simultaneous mold-matching, it is possible to carry out molding and film formation at the same time, wherein work efficiency can be improved.

According to the eleventh aspect, because the film-forming means is provided in the second mold which is removed from a molding, the mold structure is not complicated.

According to the twelfth aspect, because the film-forming means is provided in the second mold which is a fixed mold, it is not necessary for movement of the means to be taken into consideration, wherein the structure can be simplified.

According to the thirteenth aspect, it is possible to simply form a film on the reflection surface.

According to the fourteenth aspect, it becomes possible to mask a part of the exposed portion.

According to the fifteenth aspect, it becomes possible to carry out incorporation of a masking member in a series of processes.

According to the sixteenth aspect, it becomes possible to embody the masking member by effectively using the peripheral edge of the recessed portion in which the film-forming means is accommodated.

According to the seventeenth aspect, it becomes possible to carry out masking by using the mold-matching process.

According to the eighteenth aspect, insulation can be maintained when a metal film is formed.

According to the nineteenth aspect, because the portion where the moldings are adhered to each other by the third molding can be protected by masking, it is possible to prevent the adhesion from becoming defective.

According to the twentieth aspect, it is possible to easily produce a product having a formed film, such as a reflection surface, provided on the interior thereof as in a lamp body through a series of work processes.

According to the twenty-first aspect, because film-forming means is provided in the second mold from which a molding is removed, efficient film formation can be carried out.

According to the twenty-second aspect, because the film-forming means is fixed, it is not necessary to take movement thereof into consideration.

According to the twenty-third aspect, it is possible to simply form a film for the reflection surface.

According to the twenty-fourth aspect, it is possible to easily carry out masking at a part of a portion exposed by mold removal.

According to the twenty-fifth aspect, it is possible to carry out incorporation of a masking member by a series of work processes.

According to the twenty-sixth aspect, masking can be carried out by effectively using the peripheral edge of an accommodation portion for accommodating the film-forming means.

According to the twenty-seventh aspect, masking can be carried out by a mold surface exclusive for masking, which is provided in the second mold.

According to the twenty-eighth aspect, the formed film can be freed from any damage in its insulation.

According to the twenty-ninth aspect, it becomes possible to protect the surface portion, where the moldings are adhered to each other, from film formation.

According to the thirtieth aspect, it is possible to provide a mold by which molding and film formation can be carried out.

According to the thirty-first aspect, the film-forming means can be structured with movement thereof not taken into consideration.

According to the thirty-second aspect, it becomes possible to provide the film-forming means by using the mold.

According to the thirty-third aspect, it becomes possible to form a film at the portion exposed by mold removal with masking provided.

According to the thirty-fourth aspect, masking can be carried out by effectively using the second mold.

According to the thirty-fifth aspect, film formation at the portion exposed by mold removal can be achieved by the peripheral edge of the recessed portion in which the film-forming means is accommodated.

According to the thirty-sixth aspect, the exposed portion can be masked by a mold surface exclusively provided in the second mold.

According to the thirty-seventh aspect, diversity of the masking can be secured.

According to the thirty-eighth aspect, a film-formed molding can be efficiently produced in such a manner that no mold-tightening force is adjusted.

According to the thirty-ninth aspect, a film-formed molding can be efficiently produced in such a manner that no mold-tightening force is adjusted.

According to the fortieth aspect or the forty-first aspect, film-formed products having the same shape and products having different shapes can be simultaneously produced by using one mold.

BRIEF DESCRIPTION OF THE DRAWINGS

The disclosure will be made with reference to the drawings, in which.

DETAILED DESCRIPTION OF EMBODIMENTS

Figure 1:
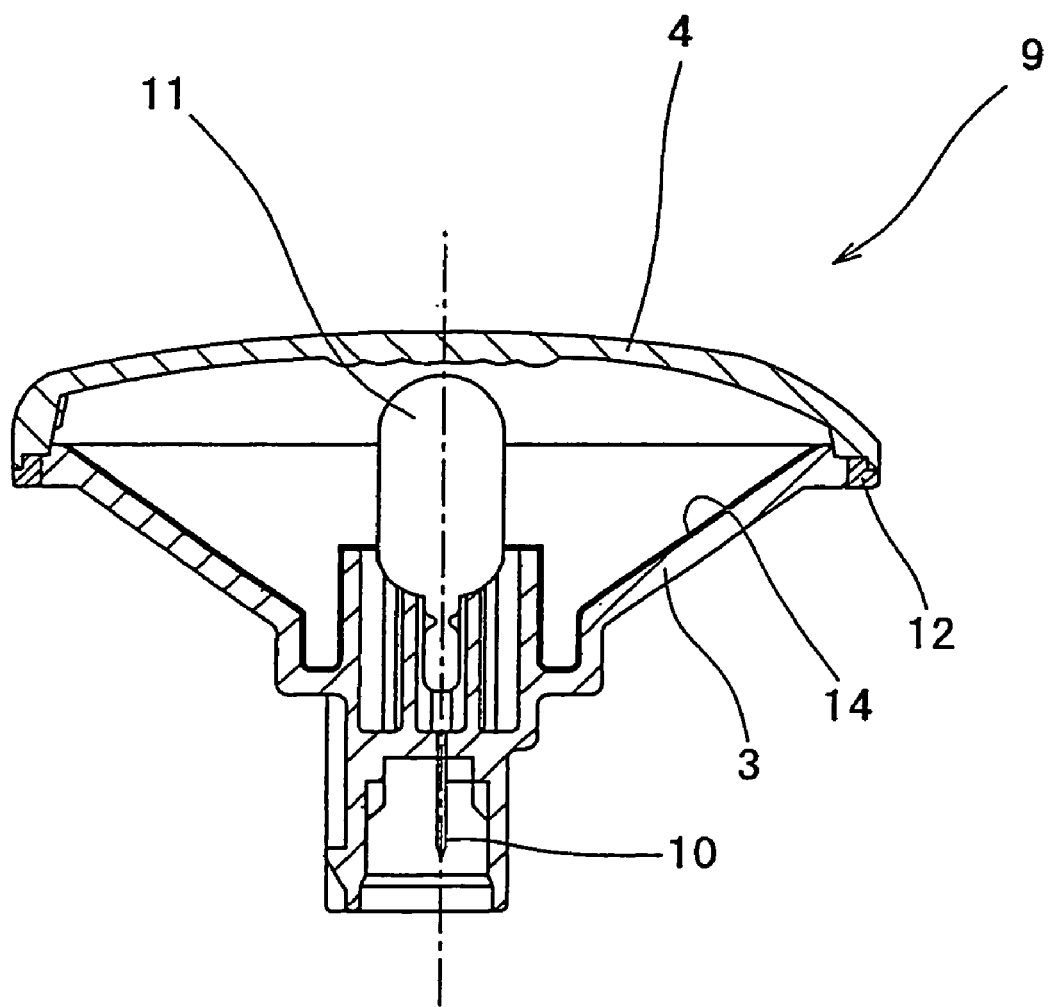
FIG. 1 is a longitudinal cross-sectional view showing a side blinker.
Figure 2:
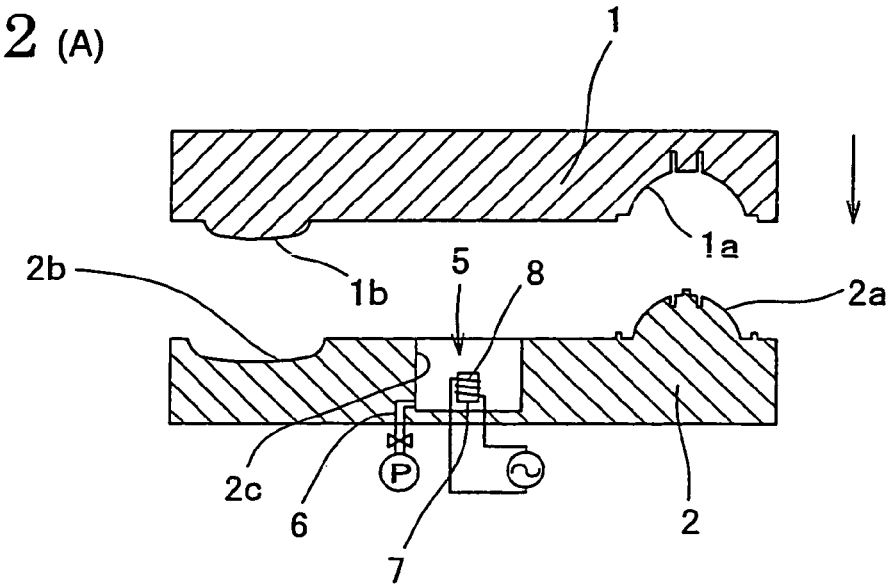
FIGS. 2(A) through 2(C) are schematic, cross-sectional views showing the processes of the primary injection.
Figure 2:
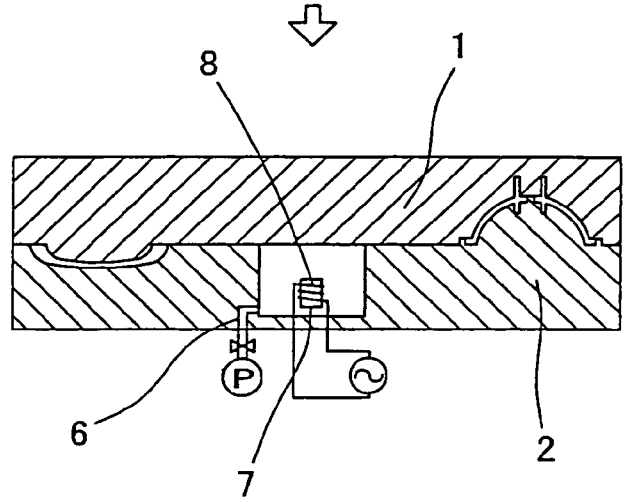
Figure 2:
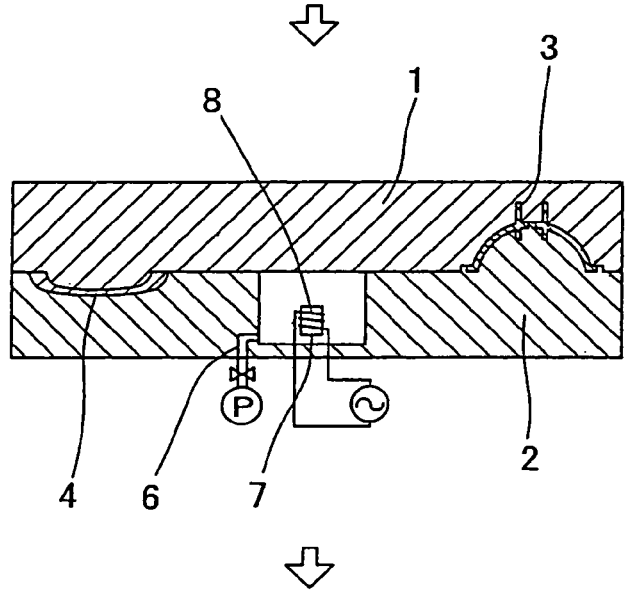
Figure 3:
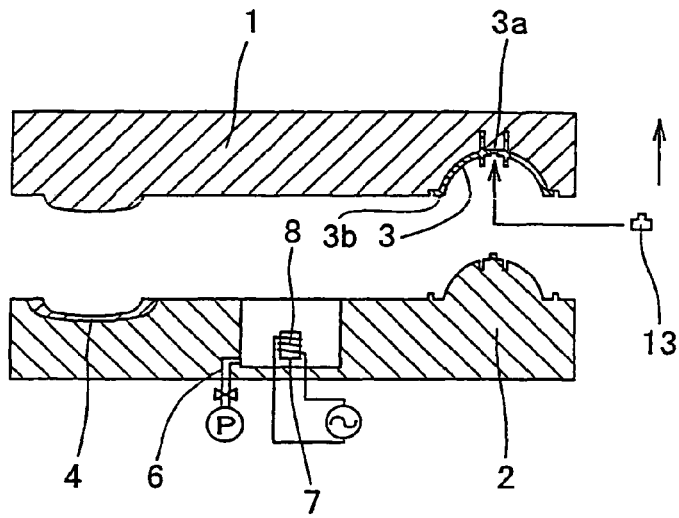
FIGS. 3(A) through 3(C) are schematic, cross-sectional views showing the processes of the secondary mold matching.
FIG. 3(D) is an enlarged view depicting the major parts of a mold.
Figure 3:
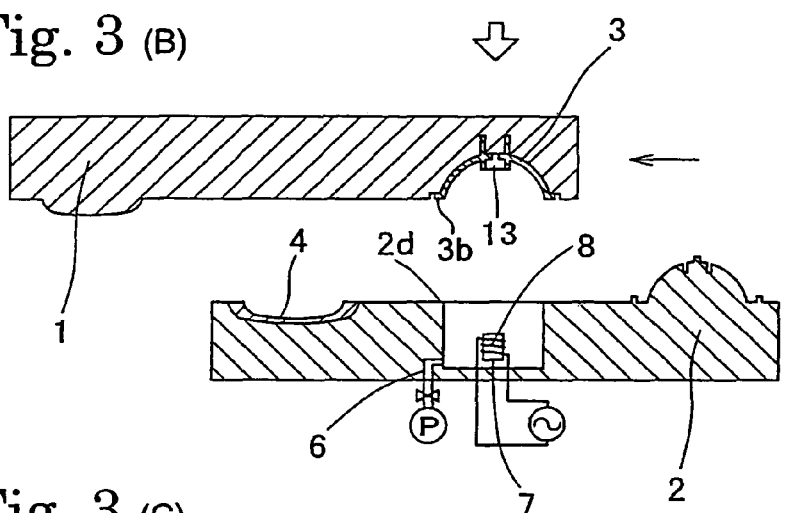
Figure 3:
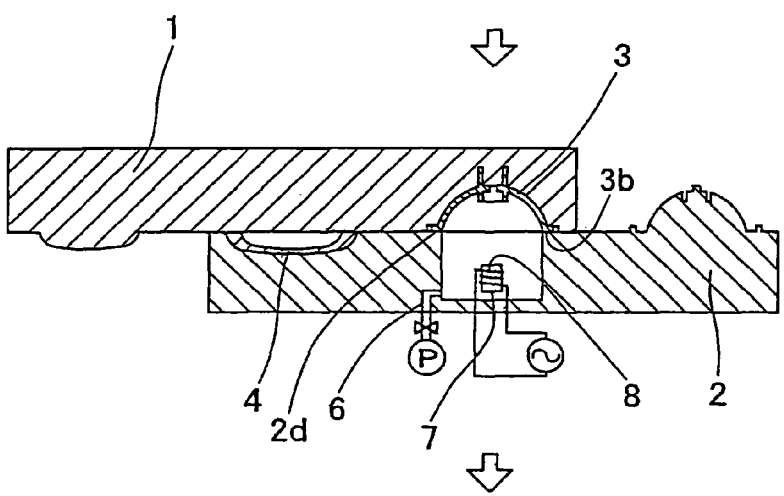
Figure 3:
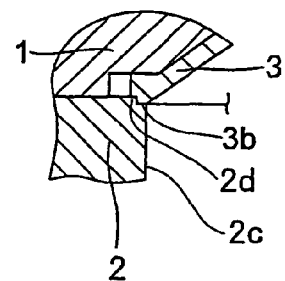
Figure 4:
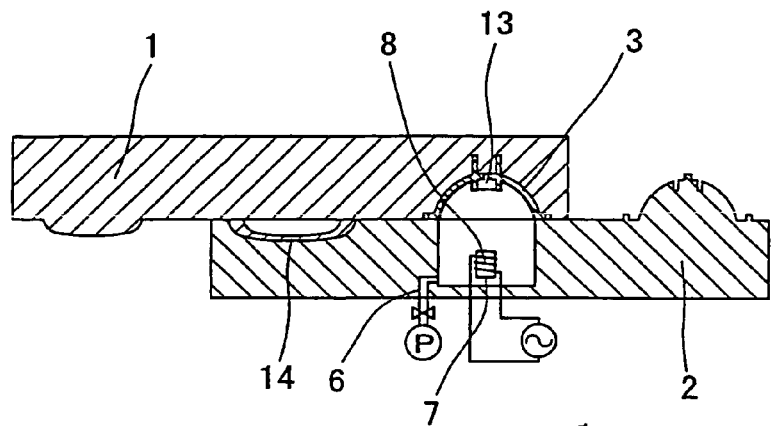
FIGS. 4(A) through 4(C) are schematic, cross-sectional views showing the processes to add a lamp holder to a lens portion.
Figure 4:
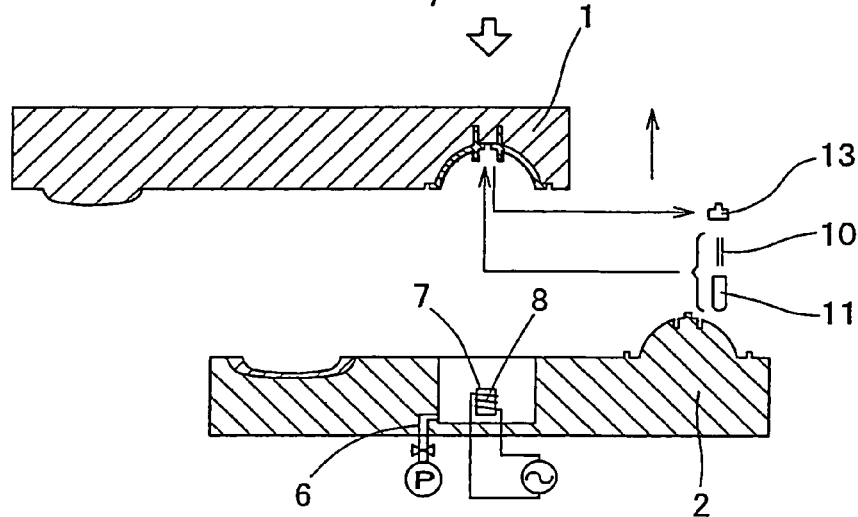
Figure 4:
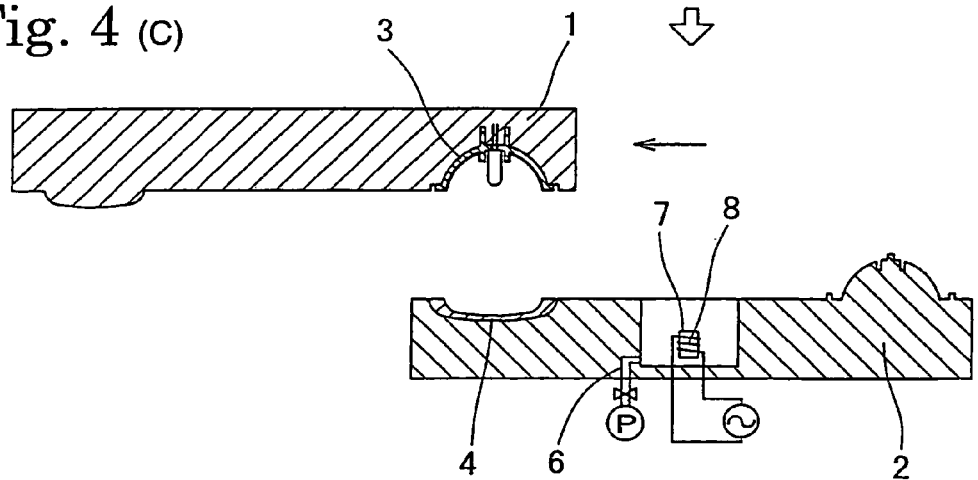
Figure 4:
Figure 5:
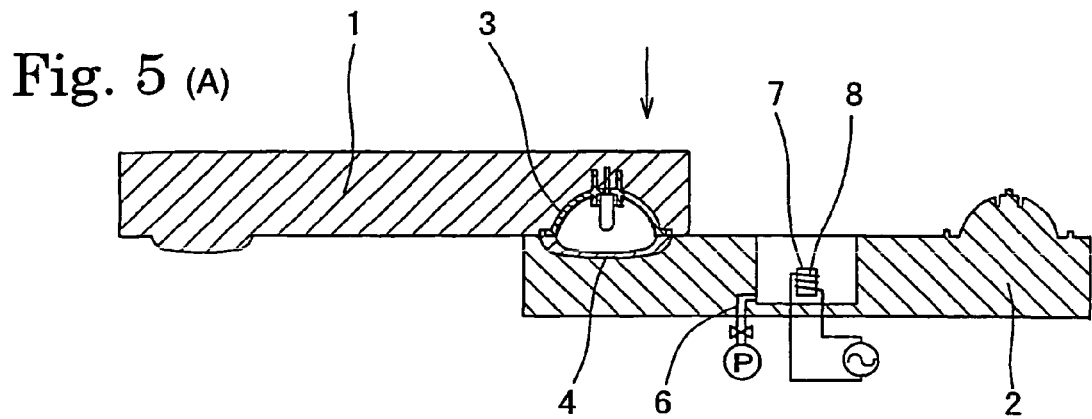
FIGS. 5(A) through 5(C) are schematic, cross-sectional views showing the processes for removal of a lamp body.
Figure 5:
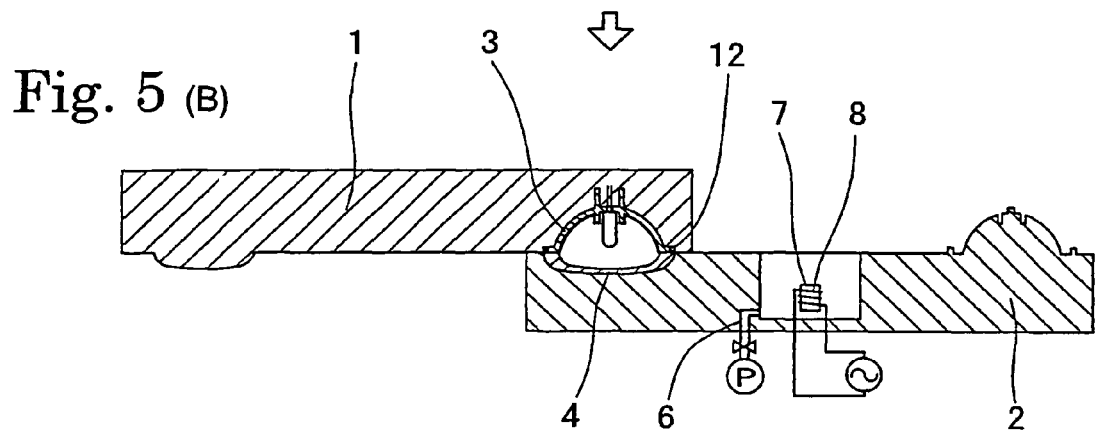
Figure 5:
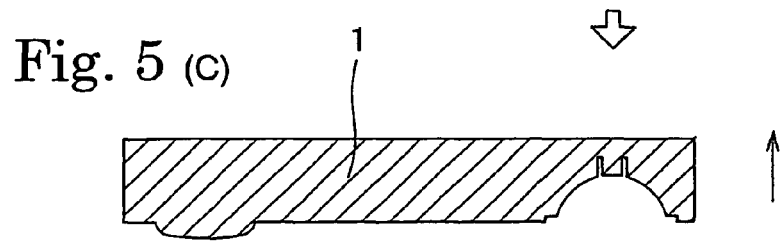
Figure 5:
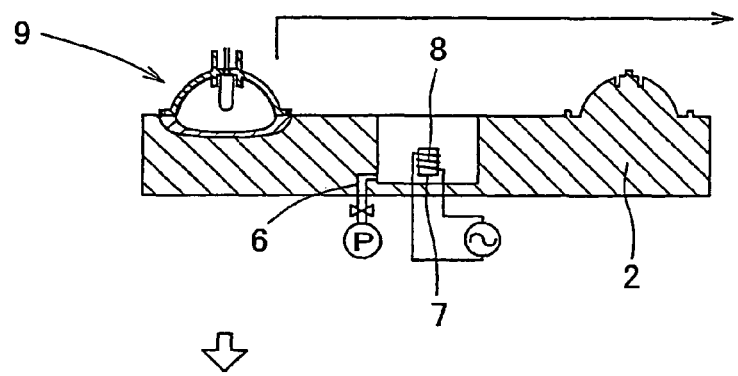

Next, a description is given of a first exemplary embodiment with reference to FIGS. 1 through 5. In the drawings, reference number 1 denotes a movable mold (the first mold), and 2 denotes a fixed mold (the second mold). The movable mold 1 is movable (to be separated from and contacted to) in opposite directions with respect to the second mold 2 and is also structured to be movable in the direction along the face of the fixed mold 2 (parallel movement) in a state apart from the fixed mold 2. However, as technology used for prior art mold slide injection can be employed, as it is, for the detailed movement mechanism, a detailed description thereof is omitted. Also, because movement of the molds may be relative to each other, it may be such that the first mold is fixed and the second mold is movable. Further, it is a matter of course that both the molds are structured to make relative movement. In addition, if the movement is movement in the direction along the facial region, the movement may not only be parallel movement in the linear direction but also rotating movement centering around an axis.

Formed in the movable mold 1 are a concave mold surface 1a, for forming the outside face of a lamp holder 3, and a convex mold surface 1b, for forming the inside face of a lens portion 4. A convex mold surface 2a, for forming the inside face of the lamp holder 3, and a concave mold surface 2b, for forming the outside face of the lens portion 4, are formed in the fixed mold 2. Further, a concave mold surface 2c is formed in the fixed mold 2, as film-forming means. The concave mold surface 2c accommodates (internally includes) a vacuum deposition apparatus 5 as employed in the present embodiment. The concave mold surface 2c is formed between the convex mold surface 2a, for forming the inside face of the lamp holder 3, and the concave mold surface 2b, for forming the outside face of the lens portion 4. Although a publicly known vacuum deposition apparatus 5 is employed, the vacuum deposition apparatus 5 is briefly described. The vacuum deposition apparatus 5 is provided with an air suction path 6 connected to a vacuum pump P, a boat (target) 7 in which metal (for example, aluminum and chromium) to be deposited is accommodated, and a heater 8 for heating the boat 7.

A lamp body 9 is a side blinker in this described exemplary embodiment. A terminal 10 and a bulb 11 are incorporated therein as necessary components. The lamp body 9 is composed of the lamp holder 3, molded with a non-translucent resin material, and a lens portion 4, molded with a translucent resin material. As described later, after the lamp holder 3 and the lens portion 4 are molded by the primary injection molding process, the movable mold 1 is moved (mold-slid), wherein the lamp holder 3 and the lens portion 4 are mold-matched. A resin material 12 is then secondarily injection-molded along the mold-matched face portions so the components are integrated to produce the lamp body 9.

A method for producing the lamp body 9 will now be described with reference to the drawings. FIG. 2(A) shows that, with respect to both the molds 1, 2, the mold surfaces 1a, 2a for forming the lamp holder 3, and the mold surfaces 1b, 2b for forming the lens portion 4 are opposed to each other in a state spaced from each other. The movable mold 1 is moved to the fixed mold 2 side from the state of being spaced from each other, and the mold surfaces opposing each other are mold-matched (primary mold-matching process: refer to FIG. 2(B)). In the mold-matched state, primary injection molding is carried out, wherein the lamp holder 3 and the lens portion 4 are injection-molded, respectively (primary injection molding process: refer to FIG. 2(C)).

Thereafter, as shown in FIG. 3(A), a mold removing process, in which the movable mold 1 is moved in the direction such that the movable mold 1 is released, or opened, from the fixed mold 2, is executed. At this time, the molds are designed so that the lamp holder 3 is supported (remains) in the movable mold 1 without being released, and the lens portion 4 is supported (remains) in the fixed mold 2 side without being released. Next, after the movable mold 1 moves laterally (refer to FIG. 3(B)) so that the lamp holder 3 is opposed to the vacuum deposition apparatus 5, the movable mold 1 moves to the fixed mold 2 side and is mold-matched (secondary mold-matching process: refer to FIG. 3(C)).

In a state where both of the molds 1, 2 are apart from each other before or after making the lateral movement, a masking, or covering, member 1 for masking (covering) portions that are not to be vacuum-deposited, that is, a portion for receiving both the terminal 10 and an insertion portion 3a of the bulb 11 that are part of the lamp holder 3 (masking member incorporating process). The masking member incorporating process is carried out. In the embodiment, the masking member 13 is incorporated at a stage before making parallel movement. Also, the molds are designed so that the peripheral portion 2d, at the opening side of the concave mold surface 2c that internally includes the vacuum deposition apparatus 5, masks the mold-matching surface, or cementing portion, 3b, that attaches the lamp holder 3 to the lens portion 4, and the mold-matching surface 3b is not vacuum-deposited (FIG. 3(D)).

As the lamp holder 3 and the vacuum deposition apparatus 5 are entered into a mold-matched state where they are opposed to each other, air in the concave mold surface 2c is removed through the air suction path 6 to cause the interior to become a vacuum. In this state, molten metal supplied to the boat 7 is evaporated by the heater 8, wherein the metal is vacuum-deposited on an exposed inner surface of the lamp holder 3, and a reflection surface 14 is film-molded (film, or reflection surface, forming process of FIG. 4(A)). Next, the movable mold 1 is released from the fixed mold 2 (FIG. 4(B)). Thereafter, the movable mold 1 is moved in parallel to the fixed mold 2 to cause the lamp holder 3 and the lens portion 4 to be opposed to each other (FIG. 4(C)). In this connection, before and/or after moving the movable mold 1 in parallel, a process for removing the masking member 13 and a process for incorporating the terminal 10 and the bulb 11, as necessary components, are carried out.

After that, the movable mold 1 is moved to the fixed mold 2, and the lamp holder 3 and the lens portion 4 are mold-matched (third mold-matching process of FIG. 5(A)). A resin material 12 is secondarily injected to the mold-matched surface between the lamp holder 3 and the lens portion 4 (secondary injection molding process of FIG. 5(B)), whereby the lamp holder 3 and the lens portion 4 are integrated, and a lamp body 9 having a reflection surface 14 formed thereon is formed. Then, the movable mold 1 is spaced from the fixed mold 2, and the molded lamp body 9 is removed (released from the mold; FIG. 5(C)). After that, the movable mold 1 moves in parallel to the initial position of FIG. 2(A). Subsequently, the process is repeated.

In the just described embodiment, when producing the lamp body 9, because a film-forming process for forming a reflection surface 14 on the inner surface of the lamp holder 3 is provided between the primary injection molding process for forming the lamp holder 3 and the lens portion 4 and the secondary injection molding process for integrating the lamp holder 3 and the lens portion 4, any work for removing the lamp holder 3 and resetting the same is no longer required as it was in the prior art. In the prior art it was also necessary that, after a reflection surface was formed on the lamp holder 3 once removed from the mold, the lamp holder 3 needed to be set in the mold again thereafter. However, in the embodiment, it is possible to produce the lamp holder 3 and to form a film for the reflection surface in a series of mold sliding processes, wherein work efficiency can be improved. Furthermore, because it is not necessary that the lamp holder 3 be removed and reset, there is no case where fingerprints can adhere to the reflection surface 14 by touching the same or that the reflection surface is damaged due to being brought into contact with any other materials, wherein the generation of defects can be reduced to a large extent.

Still further, in the embodiment, in the film-forming process, the outer surface of the lamp holder 3 (that is, the surface covered by the first mold 1) is supported, as it is, in the movable mold 1 without being released therefrom, that is, is completely hidden from the outside, wherein the first mold 1 itself functions as a masking member with respect to the surface of the lamp holder 3 (the surface when the lamp holder is made into a final product), and there is no case where any film is formed on the outer surface of the lamp holder 3. Furthermore, in this case, because the concave mold surface 2c in which the vacuum deposition apparatus 5 body is accommodated is formed on the second mold 2, that is a fixed mold, the vacuum deposition apparatus 5 is fixed, wherein, as in the case where the vacuum deposition apparatus 1 is installed in the movable mold 1 side, it is not necessary to employ a structure for which movement of pump piping and wiring must be taken into consideration. Therefore, the structure is simplified along with improved durability.

Still further, in the embodiment, because, if a reflection surface of metal film is formed on portions where the reflection surface is not desired to be formed, that is, on the portions where the terminal 10 and the bulb 11 are attached to, insulation is spoiled and circuits are shorted, those portions are filled by the masking member 13, and the reflection surface 14 is formed. Therefore, a lamp body 9 that is free from any problem of short-circuiting can be produced. Furthermore, in the embodiment, because the terminal 10 and the bulb 11 are incorporated after removing the masking member 13 after the reflection surface 14 is formed, all the production work can be smoothly carried out in a series of mold-sliding processes. As a result it is possible to efficiently produce the lamp body 9.

Still further, although the lamp body 9 is structured so that the mold-matching portion between the lamp holder 3 and the lens portion 4 are cemented, or adhered, together in the secondary injection molding process, when forming a film in the lamp holder 3, the cementing portion 3b is masked by the peripheral portion 2d at the opening side of the concave mold surface 2c in which the vacuum deposition apparatus 5 body is accommodated (FIG. 3(D)). Therefore, there is no case where a film is formed on the cementing portion 3b. As a result, it is not necessary to use any exclusive masking member 13 with respect to masking the cementing portion 3b with the lamp holder 3 held in the first mold 1, as the cementing portion 3b is masked by using the second mold 2. Thus, there is no case where a film is formed on the portion molded in the secondary injection molding process, and the lamp holder 3 and the lens portion 4 can be securely adhered to each other, wherein work efficiency can be increased.

Also, because the concave mold surface 2c for accommodating the vacuum deposition apparatus 5 body, which is formed in the fixed mold 2, is disposed between the mold surfaces 2a, 2b on which the lamp holder 3 and the lens portion 4 are formed, the direction along which the movable mold 1 moves from the primary injection molding process to the reflection surface forming process becomes identical to the direction along which the movable mold 1 moves from the reflection surface forming process to the secondary injection molding process. As a result, there is an advantage in that the structure of the mold-sliding mechanism can be simplified.

In addition, the disclosure is not limited to the above-described embodiment, and the film formation is not limited to a reflection surface, such as a mirror-like surface, but it may be film formation based on painting, etc. Furthermore, the film-forming means is not limited to an vacuum deposition apparatus. Various types of known film-forming apparatuses may be employed, in which a physical vapor deposition method (PVD) such as spattering deposition, etc., a chemical vapor deposition method (CVD) such as thermal deposition and plasma deposition, etc., are available. In addition, in the case of a molding such as a lamp holder, the molding may be made into such a type in which accessories such as a terminal and a bulb, etc., are installed after molding.

Also, although the embodiment is produced by injection molding as a molding process, the process is not limited to such molding process. It may be embodied in a commonly known molding technique such as, for example, press molding, blow molding, etc. Still further, if, for instance, a description is given of a case where the final product is a completed lamp body, the disclosure is also applicable to a case where the lamp body is not continuously molded to the end, rather an intermediate product in which a mirror-like surface 14 is formed on the lamp holder 3 is molded, and the molding is released from a mold and is used as a component. Also, the film-forming apparatus may be not only provided in the same mold as the mold for forming a surface which becomes a mirror-like surface, but also provided in a different mold.

In addition, with respect to the mold, an example in which two molds comprising the first mold and the second mold are employed was described in the above-described embodiment. Where a molding has a complicated shape, which cannot be molded using only two molds is molded, it is possible to increase the number of molds as necessary, for example, a third mold, a fourth mold, etc. In this case, it is a matter of course that the embodiment is structured so that masking is carried out with at least one of the molds.

Figure 6:
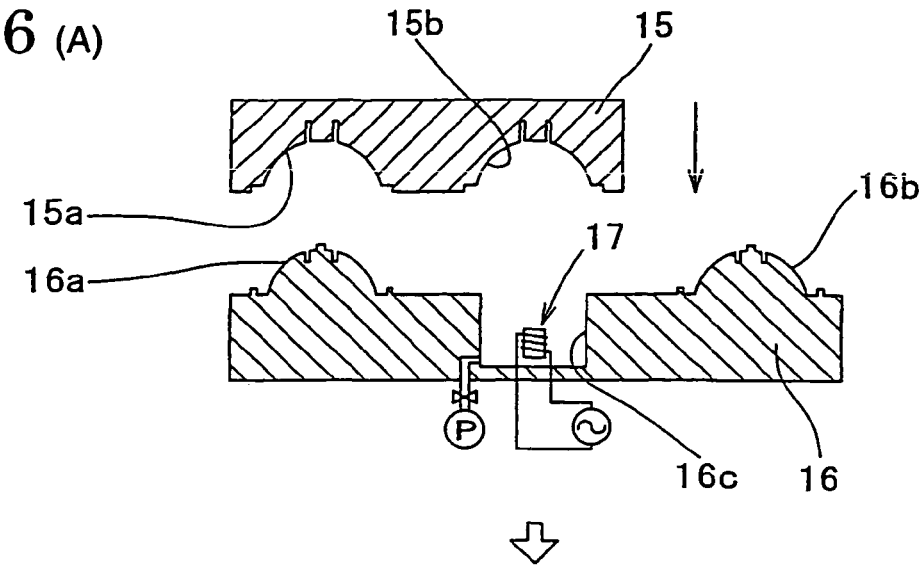
FIGS. 6(A) through 6(C) are parts of a schematic, cross-sectional view of processes according to a second embodiment.
Figure 6:
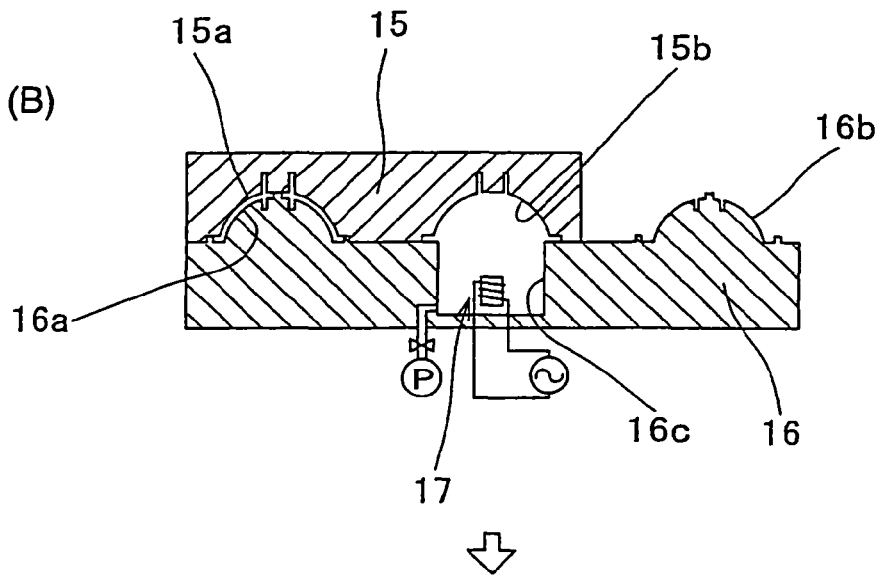
Figure 6:
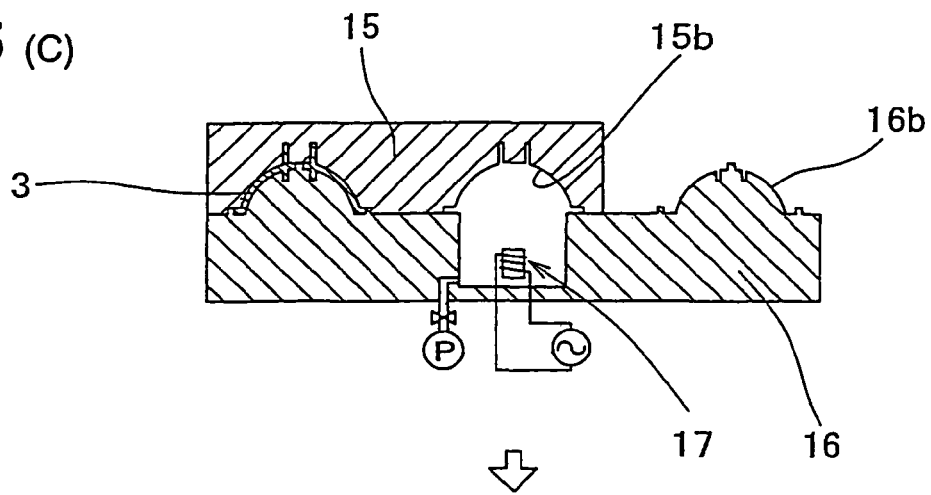
Figure 7:
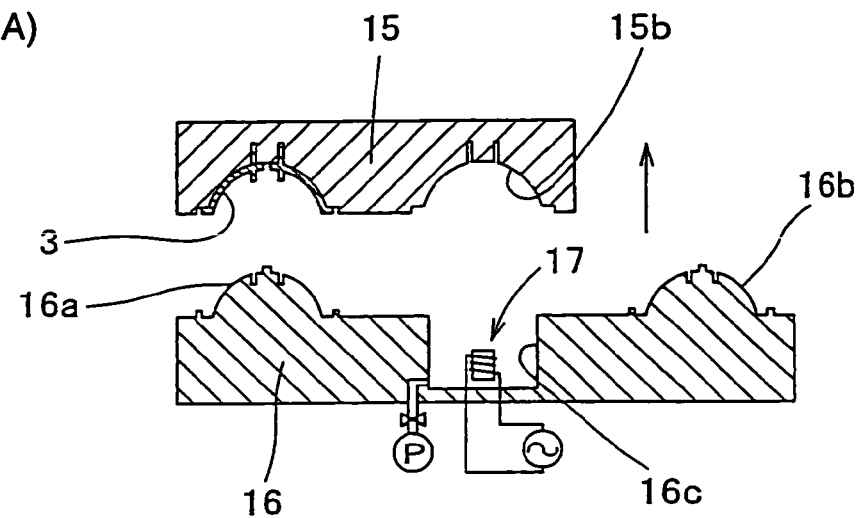
FIGS. 7(A) through 7(C) are parts of a schematic, cross-sectional view of processes according to the second embodiment.
Figure 7:
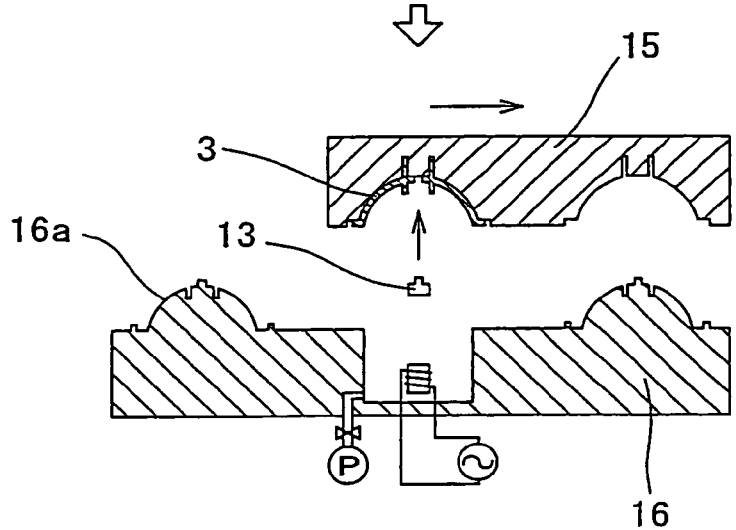
Figure 7:
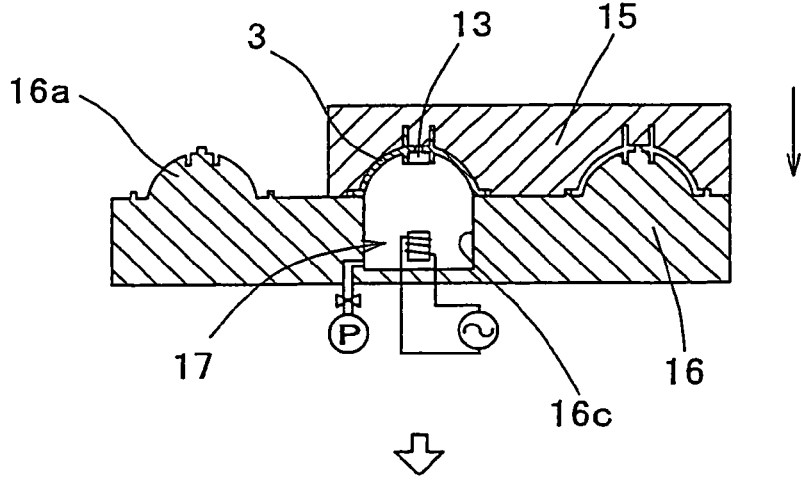

Furthermore, a description is given of a second embodiment with reference to FIGS. 6 (A) through 9(C). The second embodiment carries out film formation of a lamp holder 3 molded through a series of processes, and is provided with the first mold 15 being a movable mold and the second mold 16 being a fixed mold. A pair of the first and second mold surfaces 15a, 15b for forming the surfaces of lamp holders 3 are formed in the first mold 15 with a predetermined spacing therebetween. On the other hand, the first and second mold surfaces 16a, 16b for forming the interior surfaces of lamp holders 3 are provided at each side of the second mold 16 with the predetermined spacing therebetween. A mold surface portion 16c, in which the vacuum deposition apparatus 17 is accommodated, is placed at the middle part between the mold surfaces 16a, 16b. According to the embodiment, after the first mold 15 moves in the mold-matching direction from a state where, as depicted in FIG. 6(A), the first mold surfaces 15a, 16a are opposed to each other (at this time, the second mold surface 15b of the first mold 15 is opposed to the mold surface portion 16c of the second mold 16), and the first mold-matching process is carried out, a resin material is injected and the lamp holder 3 is molded (FIGS. 6(B) and 6(C)). Thereafter, after the first mold 15 executes a mold-removing process in which the first mold 15 is separated (FIG. 7(A)), the first mold 15 moves in parallel to (laterally toward) the right side in the drawing by the predetermined spacing, whereby the second mold surfaces 15b, 16b are opposed to each other. At that time, the first mold surface 15a is opposed to the mold surface portion 16c (FIG. 7(B)). Also, in the embodiment, either prior to or after movement of the first mold 15, an attaching process of the masking member 13 is carried out. Subsequently, after the second mold-matching process is carried out, in which the first mold 15 is moved so as to be brought into contact with the second mold 16 (FIG. 7(C)), the film-forming process by the vacuum deposition apparatus 17 and the injection molding process using the second mold surfaces 15b, 16b are simultaneously carried out, wherein the previously formed lamp holder 3 has a film-formed surface 18 formed thereon and a second lamp holder 3 is formed at the same time (FIG. 8(A)).

Figure 8:
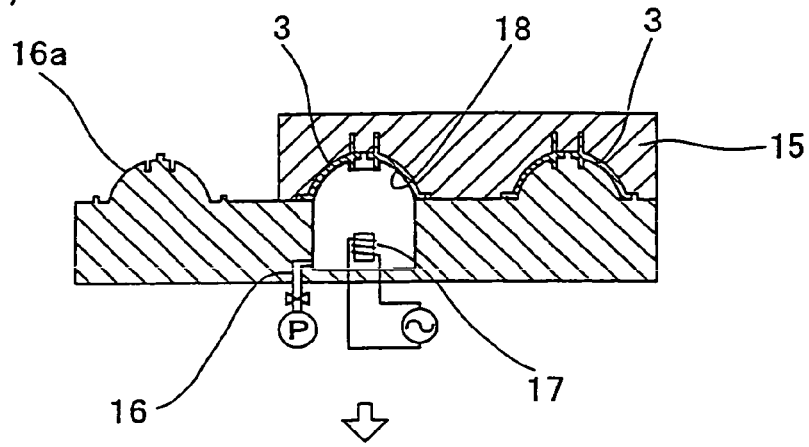
FIGS. 8(A) through 8(C) are parts of a schematic, cross-sectional view of processes according to the second embodiment.
Figure 8:
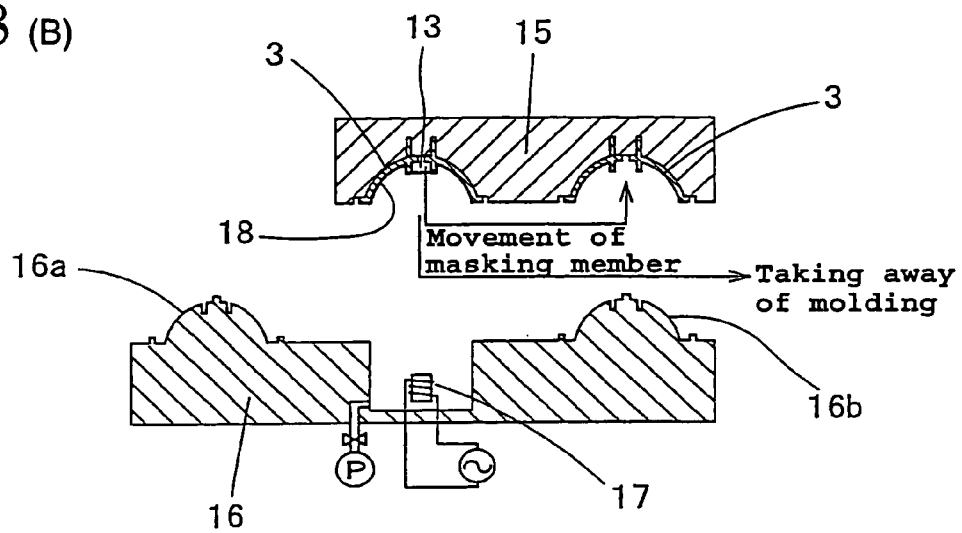
Figure 8:
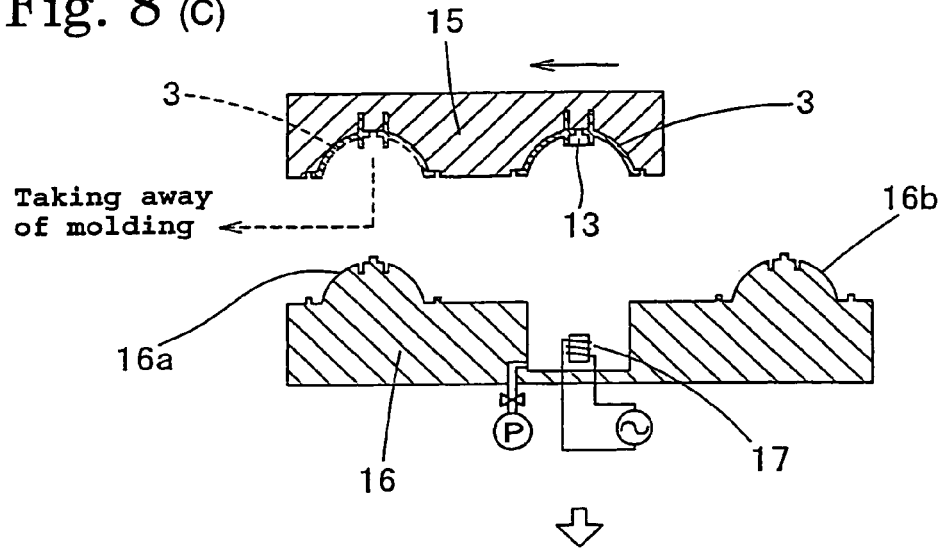

Next, the first mold 15 separates from the second mold 16 and moves in parallel toward the left side in the drawing by the predetermined spacing (FIGS. 8(B) and 8(C)). The film-formed lamp holder 3 is removed from the first mold surface 15a after the first mold 15 is separated from the second mold 16, the second mold surface 15b is moved to oppose the mold surface portion 16c, and at the same time, the first mold surfaces 15a, 16a are opposed to each other. If the mold-matching is carried out in this state, the first mold surfaces 15a, 16a are matched to each other, and the second mold surfaces 15b and mold surface portion 16c are matched to each other, wherein injection molding of another lamp holder 3 and the previously formed, lamp holder 3, held in mold surface 15a, has the film-formed surface 18 simultaneously formed thereon (FIG. 9(A)). Next, as the film-formed lamp holder 3 is taken away (FIG. 9(B)) after the first mold 15 is moved for removal, the first and the second molds 15, 16 are entered into an initially removed state (FIG. 7(A)). Thereafter, the process is repeated, wherein a plurality of film-formed lamp holders 3 can be efficiently and consecutively produced. Further, because the areas of the mold-matched surfaces completely overlap when the molds are matched to each other (that is, the first mold 15 does not protrude from a side of the second mold 16), there is an advantage in that it becomes easier to adjust the mold-tightening force.

Figure 9:
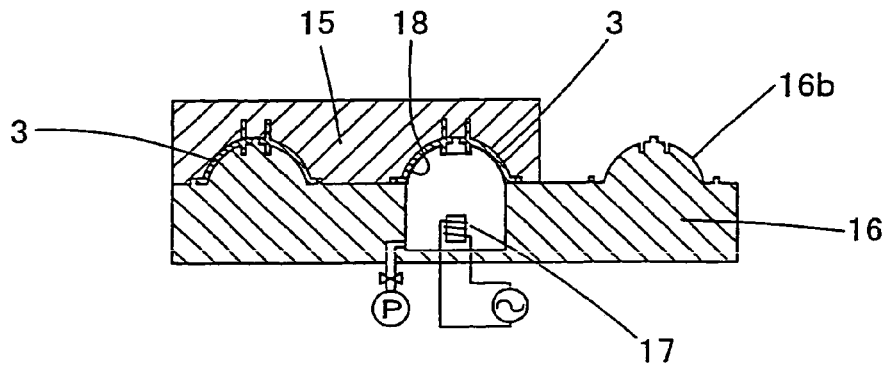
FIGS. 9(A) through 9(C) are parts of a schematic, cross-sectional view of processes according to the second embodiment.
Figure 9:
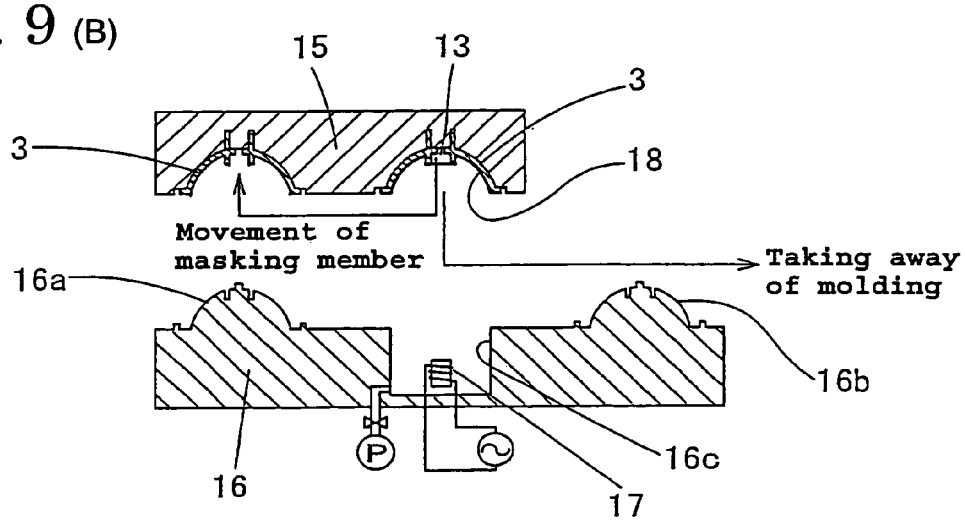
Figure 9:
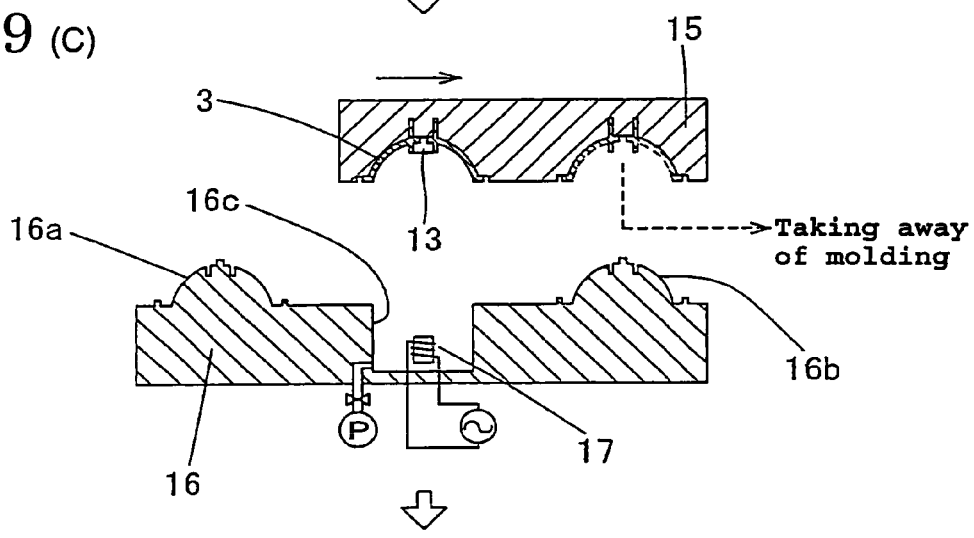

In the above-described second embodiment, where the film-formed lamp holder 3 is taken away after being removed from the molds, the lamp holder 3 can be taken away at a constant position (refer to the taking-out arrows drawn with solid lines in FIGS. 8(B) and 9(B)). Therefore, it is sufficient that only one device for taking away the film-formed lamp holder 3 may be provided (a robot such as a manipulator may be employed). However, it is necessary to employ a device which copes with a long stroke of taking away the film-formed lamp holders 3. To the contrary, where a film-formed lamp holder 3 is taken away at the point of time when the lamp holder is moved in parallel left and right after removal from the mold (refer to the arrows of taking out the lamp holders, drawn with dashed lines in FIGS. 8(C) and 9(C)), although the taking away stroke is shorter, it is necessary that a taking away device be mounted at both the left and right sides. The former case is preferable where both the first mold surfaces 15a, 16a and both the second mold surfaces 15b, 16b are mold surfaces for producing the same products. To the contrary, the latter case is preferable where in case of manufacturing different types of products, it can prevent a careless mixture of different types of products in that different products are distinguished from each other because the different types of products can be separately taken away.

Figure 10:
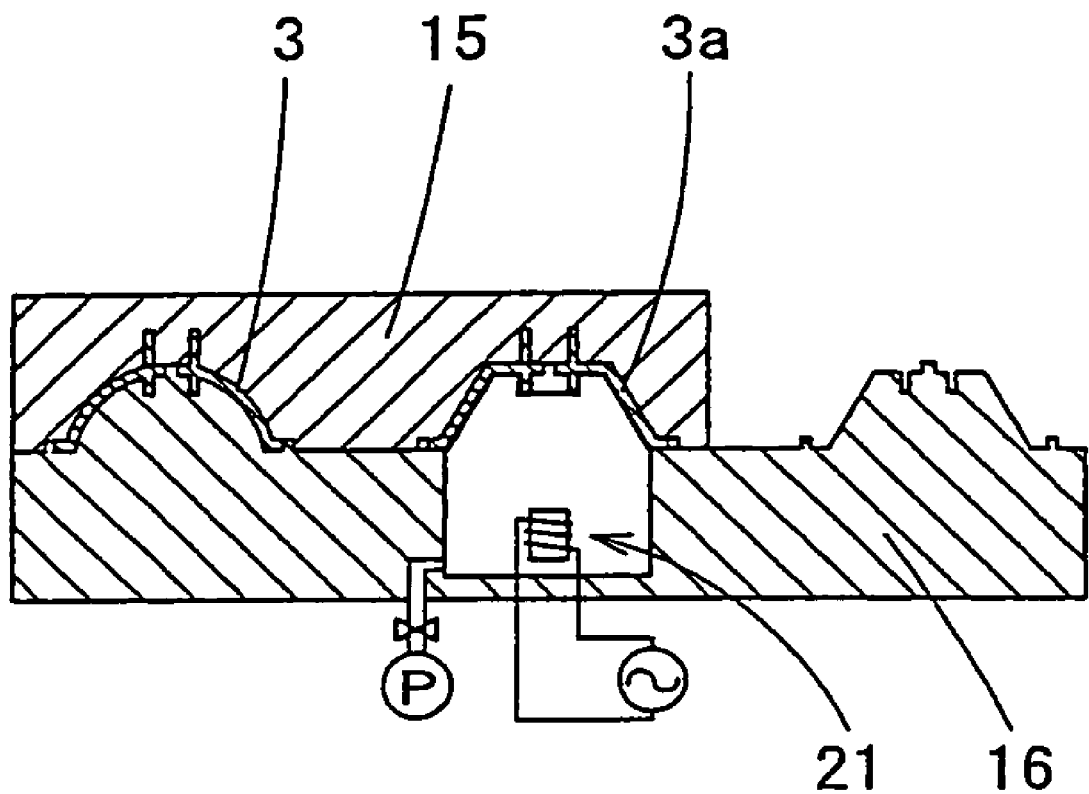
FIG. 10 is a schematic, cross-sectional view depicting a mold according to a third embodiment.

That is, in the second embodiment, the mold surfaces formed in the first and the second molds 15, 16 are those for mold-molding of the same type of members 3 and both sides have the same mold shapes. However, the mold surfaces are not limited thereto. The mold surfaces may have different shapes of mold surfaces, as in the third embodiment depicted in FIG. 10, in cases of mold-molding different types of members 3, 3a. In this case, the members 3, 3a molded on each side are different from the other. However, the production process as described can be applicable thereto. As a matter of course, it is possible that the mold surfaces formed in the second mold 16 are the same and the mold surfaces formed in the first mold 15 are different from each other or vice versa. In such cases, either side of the front surface or the rear surface of a member to be molded can be made different (FIGS. 11(A) and 11(B) as an example).

Also, although the masking member 13 may be removed from the first mold 15 integral with the film-molded molding (member) 3 and then removed from the taken away molding 3, the masking member 13 may be separately removed in a stage prior to taking away the molding 3. The masking member 13 that is removed from the film-formed molding 3 may be further incorporated in another molding 3 on which film formation is about to be carried out. Thus, it becomes possible to continuously use the masking member 13 (FIGS. 8(B) and 9(B)).

Figure 11:
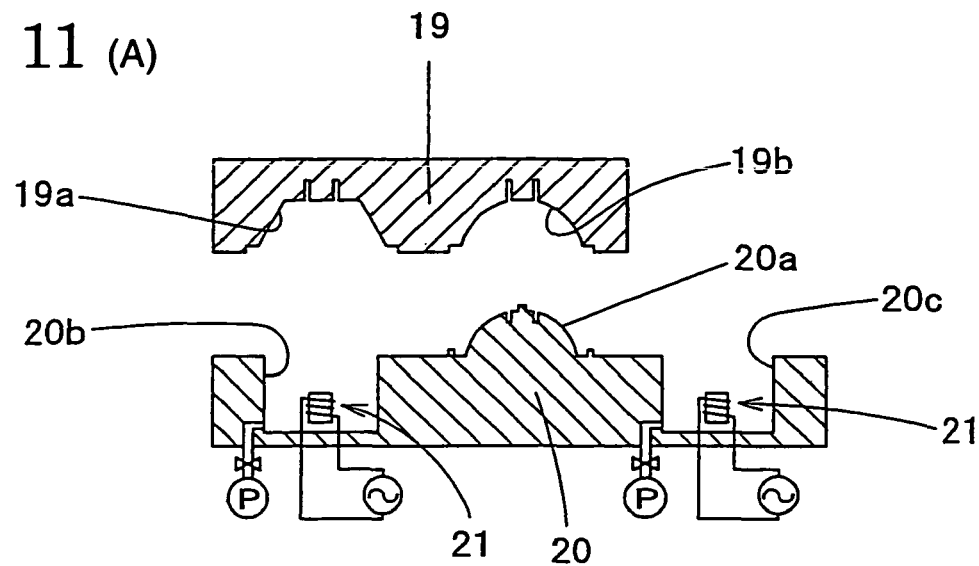
FIG. 11(A) is a schematic, cross-sectional view depicting a mold according to a fourth embodiment.
FIG. 11(B) is a schematic, cross-sectional view depicting a mold according to a fifth embodiment.
Figure 11:
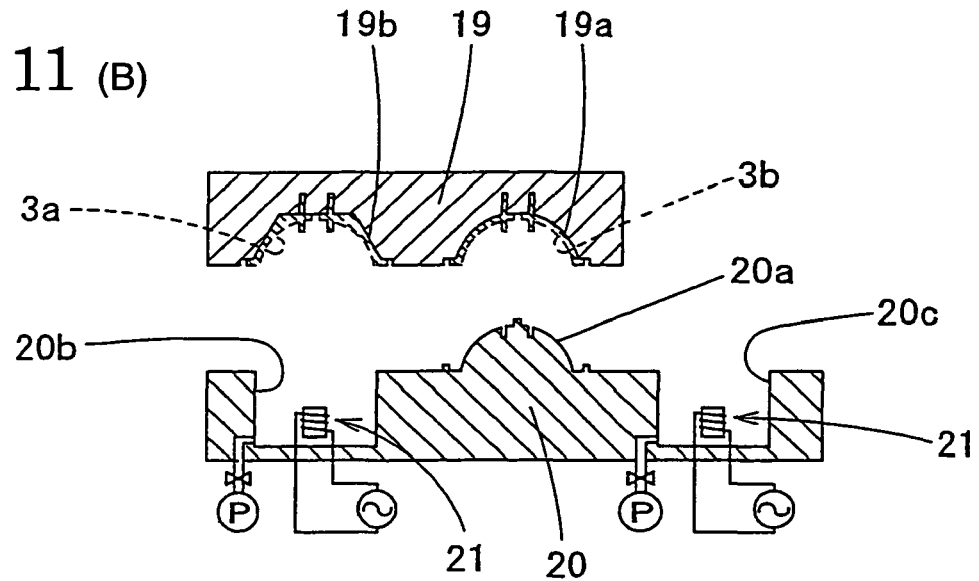

Further, the invention may be embodied as in a fourth embodiment depicted in FIG. 11(A). In the fourth embodiment, the first and the second mold surfaces 19a, 19b for mold molding are formed in the first mold 19 as in the above-described second embodiment. A mold surface 20a is formed at the middle part of the second mold 20, and the first and the second mold surface portions 20b, 20c, which accommodate film-forming apparatuses 21, are on each side of the second mold 20. That is, the fourth embodiment may be thus carried out.

As an application example thereof, a fifth embodiment may also be carried out as depicted in FIG. 11(B). That is, the fifth embodiment is such that the mold surfaces 19a, 19b formed in the first mold 19 have different shapes. Thereby, the moldings (members) may be molded with different shapes.

Figure 12:
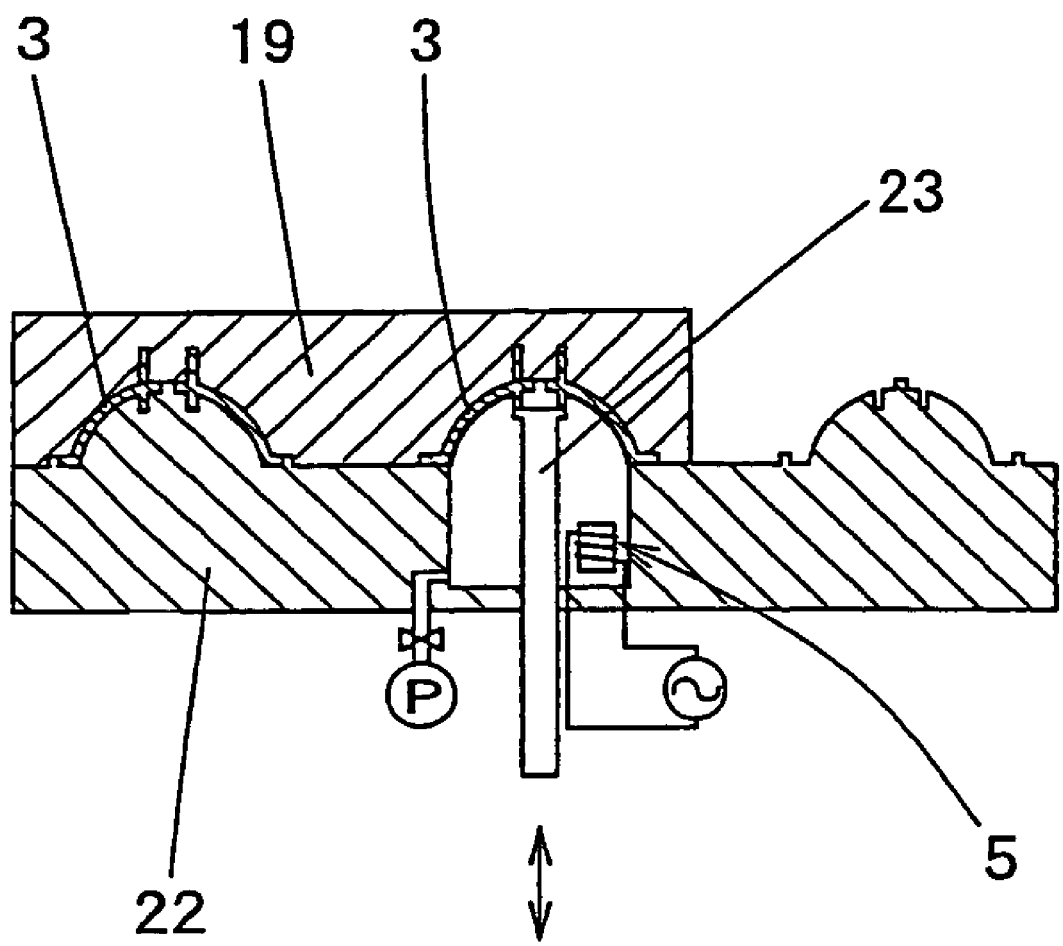
FIG. 12 is a schematic, cross-sectional view depicting a mold according to a sixth embodiment.

Still further, as means for masking a portion that is exposed by mold 1 removal, an exclusive masking means 13 may be employed as described above. In addition, the masking may be embodied in such a manner that not only masking is carried out by using the mold surface of the peripheral edge of the recessed portion 2c for accommodating the film-forming means of the second mold 2 in which the vacuum deposition apparatus 5 is provided. Also, as in the sixth embodiment depicted in FIG. 12, a masking mold 23, which can freely advance from and retreat into the second mold 22 can be provided. The mold surface of the masking mold 23 is moved so as to be brought into contact with a molding or to enclose the same in a process prior to the film-forming process, that is, simultaneously with the second mold-matching process, before or after the second mold-matching process, so that the exposed portion can be partially masked.

Figure 13:
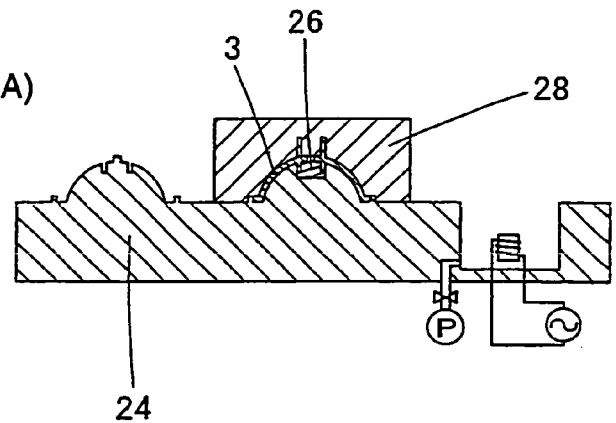
FIGS. 13(A) through 13(C) are schematic, cross-sectional views of processes of the major parts according to a seventh embodiment.
Figure 13:
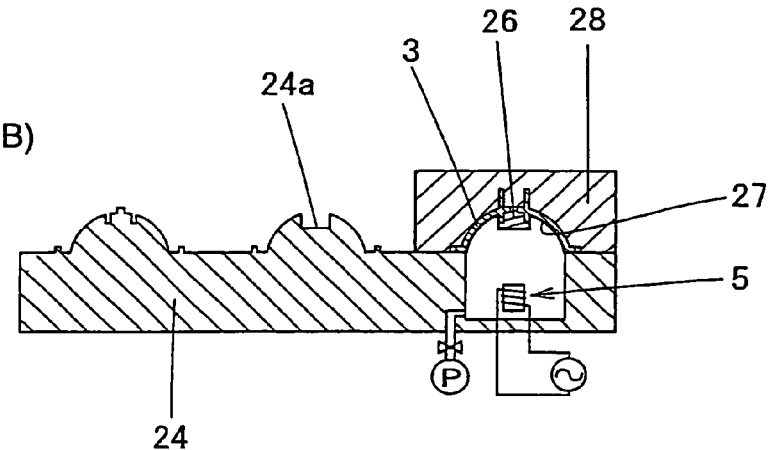
Figure 13:
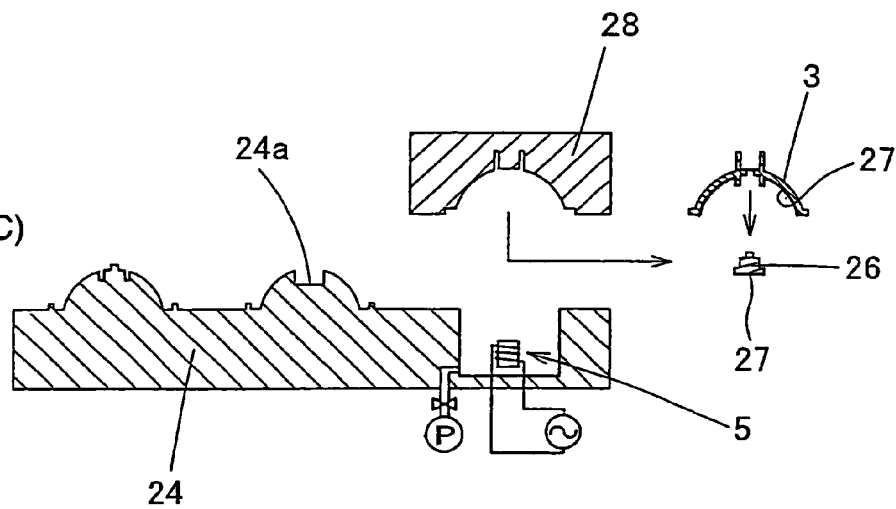

Still further, as in the seventh embodiment depicted in FIGS. 13(A)-13(C), the masking may be carried out in such a manner that, after a mold surface 24a for injecting a masking portion 26, composed of a material which can be easily removed from a molding 3, for masking a part of the exposed surface of the molding 3 molded in the primary molding process, is formed in the second mold 24. After a molding 3 is formed, a process (FIG. 13(A)) for injection molding the masking portion 26 at the mold surface 24a is executed. Thereafter, a film 27 is formed by a film-forming apparatus 29 on the surface of the masking portion 26 and on the exposed surface of the molding 3 in compliance with the film-forming process (FIG. 13(B)), whereby partial masking is enabled by separating the masking portion 26 from the molding 3 after removal from the first mold 28.

Disclosed above is a film forming method for various types of moldings including headlamps, blinkers (including side blinkers), and tail lamps, etc., which are incorporated in a vehicle, a method for producing film-formed moldings, and a mold for producing the film-formed moldings. In particular, the disclosed embodiments are suitable for cases where film formation including masking is required.

The invention claimed is:

1. A method for forming a film on a molding, wherein a first mold and a second mold are, at least, provided so as to mold a first molding and a second molding, the method comprises the steps of:
   removing the first and second moldings molded in a mold-matched state, wherein:
      the first molding is not removed from the first mold so as to be left in the first mold while removing the first molding from the second mold,
      one surface of the first molding is removed from the second mold so as to be exposed,
      another surface of the first molding is not removed from the first mold so as to be unexposed, and
      the second molding is not removed from the second mold so as to be left in the second mold while removing the second molding from the first mold;
   mold-matching masking that matches a mold surface of the first mold from which the first molding is not removed to a mold surface of the second mold, a film-forming means being incorporated within the mold surface of the second mold that is different from another mold surface of the second mold that forms the first and second moldings, and further masking a portion of the exposed surface of the first molding by the mold surface of the second mold; and
   forming the film by the film-forming means.

2. The method for forming the film on the molding according to claim 1, wherein parts of the exposed surface of the first molding are further masked by a masking member.

3. The method for forming the film on the molding according to claim 2, wherein the masking member is provided in the film-forming means, and masking is carried out in the mold-matching masking step.

4. The method for forming the film on the molding according to claim 3, wherein the masking member is a peripheral edge portion at an opening side of a recessed accommodation portion for accommodating a film-forming means body.

5. A method for producing a film-formed molding, comprising:
- a first mold-matching step for bringing at least a first mold and a second mold together, which are provided to form a first molding and a second molding;
- a step of forming the first molding and the second molding;
- a step of removing the first and second moldings, where the formed first molding is held by the first mold and not removed from the first mold, one surface of the first molding is removed from the second mold so as to be exposed, another surface of the first molding is unexposed, and the formed second molding is removed from the first mold and held by the second mold;
- a mold-matching masking step for matching a film-forming means within the second mold, by which the second molding is supported, to the first molding supported in the first mold and masking a portion of the exposed surface of the first molding by a mold surface of the second mold that supports the second molding; and
- a film-forming step for forming a film on the first molding by the film-forming means.

6. The method for producing the film-formed molding according to claim 5, wherein the first mold-matching step and the mold-matching masking step are simultaneously carried out, and the forming step and the film-forming step are simultaneously carried out.

7. The method for producing the film-formed molding according to claim 5, wherein the film-forming means is provided in the second mold.

8. The method for producing the film-formed molding according to claim 5, wherein the first mold is a movable mold, and the second mold is a fixed mold.

9. The method for producing the film-formed molding according to claim 5, wherein the formed film is a reflection surface.

10. The method for producing the film-formed molding according to claim 5, further comprising a step of masking the portion of the exposed surface of the first molding by the mold surface prior to the film-forming step.

11. The method for producing the film-formed molding according to claim 10, wherein the mold surface is a peripheral edge portion at an opening side of a recessed portion provided so as to accommodate a film-forming means body in the second mold.

12. The method for producing the film-formed molding according to claim 10, wherein the mold surface is movably formed in the second mold, and the masking portion of the exposed surface of the first molding is covered by the mold surface.

13. The method for producing the film-formed molding according to claim 10, wherein a portion masked by the mold surface is a portion which is electrically insulated.

14. The method for producing the film-formed molding according to claim 10, wherein a portion masked by the mold surface is an adhesion surface portion where a third molding is adhered to the molding.

15. The method for producing a film-formed molding, comprising:
- a first mold-matching step for matching at least a first mold and a second mold, which are provided to mold a first molding and a second molding, to each other;
- a step of simultaneously molding the first molding and the second molding;
- a step of removing the formed first molding from the second mold in a state where the first molding is not removed from the first mold, and of removing the second molding from the first mold in a state where the second molding is not removed from the second mold;
- a second mold-matching step by which a film-forming means is mold-matched to the first molding;
- a step of forming a film on the first molding by the film-forming means so that the portion not removed from the first mold is masked;
- a step of separating the film-forming means from the first molding;
- a third mold-matching step for mold-matching the first mold and the second mold so that the first molding and the second molding are matched to each other; and
- a step of adhering the first molding to the second molding.

16. The method for producing the film-formed molding according to claim 15, wherein the film-forming means is provided in the second mold.

17. The method for producing the film-formed molding according to claim 16, wherein the first mold is a movable mold and the second mold is a fixed mold.

18. The method for producing the film-formed molding according to claim 15, wherein the formed film is a reflection surface.

19. The method for producing the film-formed molding according to claim 15, further comprising a step of masking a part of the surface exposed by removal of the second mold by means of a masking member prior to a film-forming step.

20. The method for producing the film-formed molding according to claim 19, wherein the masking member is incorporated in a step between the mold-removing step and the second mold-matching step.

21. The method for producing the film-formed molding according to claim 19, wherein the masking member is a peripheral edge portion at the opening side of a recessed portion provided so as to accommodate a film-forming means body in the second mold.

22. The method for producing the film-formed molding according to claim 19, wherein the masking member is a mold surface for masking, which is movably formed in the second mold, and a masking portion of the molding is covered by the mold surface for masking being moved simultaneously with, before, or after the secondary mold-matching step.

23. The method for producing the film-formed molding according to claim 19, wherein a portion masked by the masking member is a portion which is electrically insulated.

24. The method for producing the film-formed molding according to claim 19, wherein a portion masked by the masking member is an adhesion surface portion between a first molding and a second molding.

25. A mold for producing a film-formed molding, the mold comprises:
- at least a first mold having mold surfaces for forming one face portion of a first molding and a second molding, respectively, the first mold not removing the first molding, supporting the first molding, and removing the second molding; and
- a second mold having mold surfaces for forming the other face portion of the first and the second molding, respectively, the second mold not removing the second molding, supporting the second molding, and removing the first molding, wherein:
- the second mold, by which the second molding is supported, includes a film-forming means within the second mold for forming a film on the first molding supported by the first mold, and a mold surface masking portion that masks a portion of an exposed surface of the first molding, the first molding being left in the first mold while the exposed surface of the first molding is exposed from the first mold.

26. The mold for producing the film-formed molding according to claim 25, wherein the first mold is a movable mold and the second mold is a fixed mold.

27. The mold for producing the film-formed molding according to claim 25, wherein the film-forming means is provided and accommodated in an accommodation portion secured in the second mold.

28. The mold for producing the film-formed molding, according to claim 25, wherein the film-forming means forms the film so that a portion of the exposed surface is masked.

29. The mold for producing the film-formed molding according to claim 25, wherein the mold surface masking portion is a peripheral edge portion at an opening side of a recessed portion formed in the second mold so as to accommodate a film-forming means body in the second mold.

30. The mold for producing the film-formed molding according to claim 25, wherein the mold surface masking portion is movably provided in the second mold.

31. The mold for producing the film-formed molding according to claim 25, wherein a mold surface is formed in the second mold, which is matched to the first molding supported in the first mold after a film forming step with the mold surface forming a covering portion such that material can be injected onto the portion of the first molding where a film was formed.

32. The mold for producing the film-formed molding according to claim 25, wherein a pair of mold surfaces for producing the first and second moldings are provided in the first mold with a predetermined space therebetween, and in the second mold are provided the film-forming means and a pair of mold surfaces for producing the first and second moldings between which the film-forming means is placed with the predetermined space therebetween.

33. A mold surface for producing the film-formed molding according to claim 32, wherein the mold surfaces formed in the first mold and the second mold are devised so that the same moldings are mold-formed.

34. The mold surface for producing the film-formed molding according to claim 32, wherein the mold surfaces formed in the first mold and the second mold are devised so that different moldings are mold-formed.

35. The mold for producing the film-formed molding according to claim 25, wherein:
   the first and second molds are configured such that the first and second moldings are molded in a mold-matched state where the two molds are combined, and where the first molding is not removed from the first mold, the first molding has the exposed surface and an unexposed surface, and
   the second mold comprises:
      a masking means to mask the portion of the exposed surface of the molding, the masking means being a peripheral edge portion; and
      the film forming means to form the film on the first molding supported by the first mold.

* * * * *